(12) United States Patent
Rita

(10) Patent No.: US 7,387,838 B2
(45) Date of Patent: *Jun. 17, 2008

(54) LOW LOSS GLASS-CERAMIC MATERIALS, METHOD OF MAKING SAME AND ELECTRONIC PACKAGES INCLUDING SAME

(75) Inventor: Robert A. Rita, Manlius, NY (US)

(73) Assignee: Delaware Capital Formation, Inc., Wilmington, DE (US)

(*) Notice: Subject to any disclaimer, the term of this patent is extended or adjusted under 35 U.S.C. 154(b) by 136 days.

This patent is subject to a terminal disclaimer.

(21) Appl. No.: 11/084,722

(22) Filed: Mar. 18, 2005

(65) Prior Publication Data

US 2005/0266252 A1    Dec. 1, 2005

Related U.S. Application Data

(60) Provisional application No. 60/585,689, filed on Jul. 6, 2004.

(51) Int. Cl.
*B32B 17/06* (2006.01)
*C03C 10/14* (2006.01)
*C03C 10/04* (2006.01)

(52) U.S. Cl. .................. 428/426; 501/4; 501/5
(58) Field of Classification Search ........... 428/210, 428/426, 432, 433, 428, 434; 257/701; 501/4, 501/5
See application file for complete search history.

(56) References Cited

U.S. PATENT DOCUMENTS

| 2,771,969 | A | * | 11/1956 | Brownlow ............... 428/552 |
|---|---|---|---|---|
| 3,450,546 | A | | 6/1969 | Stong |
| 3,940,255 | A | | 2/1976 | Harrington et al. |
| 4,301,324 | A | | 11/1981 | Kumar et al. |
| 4,413,061 | A | | 11/1983 | Kumar et al. |
| 4,540,671 | A | | 9/1985 | Kondo et al. |
| 4,576,922 | A | | 3/1986 | O'Brien et al. |
| 4,598,167 | A | | 7/1986 | Ushifusa et al. |
| 4,666,867 | A | * | 5/1987 | Beall et al. ............... 501/5 |
| 4,687,749 | A | | 8/1987 | Beall |
| 4,761,325 | A | | 8/1988 | Kurihara et al. |
| 4,764,233 | A | | 8/1988 | Ogihara et al. |
| 4,764,486 | A | | 8/1988 | Ishihara et al. |
| 4,777,092 | A | | 10/1988 | Kawakami et al. |
| 4,794,084 | A | * | 12/1988 | Watanabe et al. ......... 435/183 |
| 4,849,379 | A | | 7/1989 | McCormick |
| 4,849,380 | A | | 7/1989 | Sawhill |

(Continued)

OTHER PUBLICATIONS

U.S. Appl. No. 11/084,718, filed Mar. 18, 2005, Rita.
*J. Am. Ceram. Soc.*, 75 [9] 2395-99 (1992), "Effect of $H_2O$ and $CO_2$ Dielectric Properties of Single-Crystal Cordierite and Comparison with Polycrystalline Cordierite."

*Primary Examiner*—Gwendolyn Blackwell
(74) *Attorney, Agent, or Firm*—Burr & Brown

(57) ABSTRACT

A glass-ceramic is provided having a thermal expansion coefficient in a range of 3-6 ppm/° C., a dielectric constant that is less than 5 and a Quality factor Q of at least 400. The glass-ceramic consists essentially of $SiO_2$ in a range of 45-58 wt %, $Al_2O_3$ in a range of 10-18 wt % and MgO in a range of 10-25 wt %. A method of making the glass-ceramic is also provided. Further, an electronic package is also provided, including a base member and a glass-ceramic substrate bonded to the base member.

11 Claims, 2 Drawing Sheets

U.S. PATENT DOCUMENTS

| | | |
|---|---|---|
| 4,883,705 A | 11/1989 | Kawakami et al. |
| 4,897,509 A | 1/1990 | Holleran et al. |
| 4,997,698 A | 3/1991 | Oboodi et al. |
| 5,073,180 A | 12/1991 | Farooq et al. |
| 5,242,867 A | 9/1993 | Lin et al. |
| 5,250,474 A | 10/1993 | Siebers |
| 5,256,469 A | 10/1993 | Cherukuri et al. |
| 5,258,335 A | 11/1993 | Muralidhar et al. |
| 5,277,724 A | 1/1994 | Prabhu |
| 5,283,104 A | 2/1994 | Aoude et al. |
| 5,304,518 A * | 4/1994 | Sunahara et al. ............. 501/62 |
| 5,337,475 A | 8/1994 | Aoude et al. |
| 5,342,674 A | 8/1994 | Tanei et al. |
| 5,468,694 A | 11/1995 | Taguchi et al. |
| 5,476,821 A | 12/1995 | Beall et al. |
| 5,514,451 A | 5/1996 | Kumar et al. |
| 5,525,855 A | 6/1996 | Gotoh et al. |
| 5,581,876 A | 12/1996 | Prabhu et al. |
| 5,658,835 A | 8/1997 | Onitani et al. |
| 5,725,808 A | 3/1998 | Tormey et al. |
| 5,744,208 A | 4/1998 | Beall et al. |
| 5,847,935 A | 12/1998 | Thaler et al. |
| 5,877,101 A | 3/1999 | Terai |
| 5,889,322 A | 3/1999 | Hamada et al. |
| 5,910,459 A | 6/1999 | Beall et al. |
| 5,958,807 A | 9/1999 | Kumar et al. |
| 5,968,857 A | 10/1999 | Pinckney |
| 5,998,036 A | 12/1999 | Stein et al. |
| 6,017,642 A | 1/2000 | Kumar et al. |
| 6,120,906 A | 9/2000 | Terashi |
| 6,121,173 A | 9/2000 | Terashi |
| 6,124,223 A | 9/2000 | Beall et al. |
| 6,232,251 B1 | 5/2001 | Terashi et al. |
| 6,245,411 B1 | 6/2001 | Goto et al. |
| 6,300,262 B1 | 10/2001 | Beall |
| 6,300,263 B1 | 10/2001 | Merkel |
| 6,303,527 B1 | 10/2001 | Pinckney |
| 6,344,423 B2 | 2/2002 | Goto et al. |
| 6,362,119 B1 | 3/2002 | Chiba |
| 6,372,376 B1 | 4/2002 | Fronk et al. |
| 6,372,676 B1 | 4/2002 | Kishida et al. |
| 6,376,055 B1 | 4/2002 | Kishida et al. |
| 6,455,930 B1 | 9/2002 | Palanisamy et al. |
| 6,739,047 B2 | 5/2004 | Hammond et al. |
| 7,186,461 B2 * | 3/2007 | Rita ........................ 428/426 |
| 2001/0029228 A1 * | 10/2001 | Terashi ........................ 501/32 |

* cited by examiner

LOW LOSS GLASS-CERAMIC MATERIALS, METHOD OF MAKING SAME AND ELECTRONIC PACKAGES INCLUDING SAME

CROSS REFERENCE TO RELATED APPLICATIONS

This application is related to U.S. patent application Ser. No. 60/585,689 filed Jul. 6, 2004, the entirety of which is incorporated herein by reference.

This application is related to U.S. patent application Ser. No. 11/084,718 filed Mar. 18, 2005 entitled 'GLASS-CERAMIC MATERIALS AND ELECTRONIC PACKAGES INCLUDING SAME," now allowed, which claims the benefit of U.S. Provisional Application Ser. No. 60/574,828 filed May 27, 2004 and U.S. Provisional Application Ser. No. 60/585,743 filed Jul. 6, 2004, the entireties of which are incorporated herein by reference.

FIELD OF THE INVENTION

The present invention relates to glass-ceramic materials for use in high frequency (i.e., gigahertz range) electronic applications, a method of making a glass-ceramic substrate and various ceramic packaging assemblies including glass-ceramic materials for use in high frequency electronic applications.

BACKGROUND OF THE INVENTION

Known multi-layered ceramic circuit boards are typically fabricated by forming layered stacks of ceramic dielectric tape, which are typically known as green tapes or green sheets. The green tapes typically comprise a ceramic material powder and/or glass powder that is mixed with suitable organic binders or resins, solvents, plasticizers and surfactants and formed into a tape. The process for making high density multi-layer circuit boards typically involves forming a plurality of pre-fabricated green tape layers having via holes punched therein, applying or printing circuit patterns on the layers using a conductive ink, i.e., a mixture of a conductive metal powder and a non-metallic powder including a glass and/or a ceramic in a solvent/binder mixture, filling the vias with the conductive ink so that the various circuit layers can be connected to one another through the thickness of the circuit board, and laminating the green tape layers together by pressing the layers into a stack. The stacked layers are then fired at a temperature exceeding 700° C. to burn off organic materials and to densify the green tape material to form a sintered glass and/or ceramic.

The sintered glass and/or ceramic circuit boards are typically quite fragile, however, and in order to impart additional mechanical strength to the laminated board, the circuit boards are often attached to one or both sides of a suitable support substrate, or core material. In addition, it may be desired to mount active, heat generating devices such as integrated circuits onto a high thermal conductivity member made of a metal or certain ceramics (e.g., AlN, SiC, etc.). In such situations, the glass and/or ceramic substrates are typically joined to the support structure via a solder-type bonding procedure, which is performed at low temperatures that are much less than the sintering temperature of the glass and/or ceramic substrate. Hereinafter, applications involving sintered substrates that are subsequently joined to a support core or other member are referred to as non-co-fired applications.

It is also possible to join a green laminated structure with a support member or other component as the green laminate is sintered. That is, the green laminated structure is first adhered to a support member and the structure is then fired to a temperature that is sufficient to (1) remove the organic materials from the green tapes and the conductive inks, (2) sinter or densify the particles of the green tape composition and the metal particles of the conductive inks to form a sintered multi-layer ceramic and/or glass body, and (3) sufficiently adhere the sintered multi-layer body to the support substrate. Hereinafter, applications involving green laminated structures that are fired with a support core are referred to as co-firing applications.

In both co-fired and non-co-fired cases, once bonding and densification have occurred, it is important that the sintered multi-layer body and the cooperating support structure have reasonably compatible thermal expansion characteristics, preferably closely matched thermal expansion coefficients. In most cases, however, the thermal expansion coefficient (hereinafter TEC) of the glass and/or ceramic laminate material does not closely match that of the support substrate or core on which the laminates are provided.

This thermal expansion mismatch problem is an important issue with low temperature co-fired ceramics (herein after LTCC) that are known in ceramic packaging applications, where a green laminated structure is sintered at a relatively low temperature after first being adhered to the metal support core. For example, densification of the green laminated structures during sintering can produce a large degree of volume shrinkage in the ceramic and/or glass material, for example, up to about 35-55 percent by volume. If the green laminated body is effectively bonded to an already dense support substrate or core (i.e., a core that does not itself shrink during the sintering process), the green laminated body will be constrained from sintering in the plane of the support substrate/core, which itself does not typically experience densification shrinkage when subjected to the typical sintering temperatures. This can create stresses that can be accentuated by the different expansion behaviors of the glass and/or ceramic substrate and the support member, both during the bonding process and in subsequent use in a thermally active environment.

The difference between the TEC of the material of the multi-layer substrate and that of the support substrate or core can, indeed, lead to substantial problems. For example, significant stresses can develop, particularly at the bonding interface, that lead to warping or other mechanical damage, such as non-adherence to the support substrate and misalignment between vias that are provided in the multi-layered body and the corresponding electrical feed-throughs provided on the support substrate or core. In severe cases, it is possible that the multi-layer substrate will even separate from the support, thus rendering the device unacceptable for use.

For example, most conventional, commercially available LTCC tapes have a TEC on the order of 6 to 8 ppm/° C. This often does not closely match the TEC of commonly used metal support cores, including laminated Copper-Molybdenum-Copper support cores and KOVAR® support cores. For example, a typical laminated Cu/Mo/Cu (13/74/13) support core has a TEC from room temperature to 300° C. (hereinafter $\alpha_{RT-300}$) of about 5.3 ppm/° C. and, when plated with Ni, the laminated Cu/Mo/Cu (13/74/13) support core has an $\alpha_{RT-300}$ of about 5.75 ppm/° C. For KOVAR®, the $\alpha_{RT-300}$ is about 5 ppm/° C.

It is also important that the TEC of the sintered multi-layer glass and/or ceramic substrate closely matches that of the structure to which it is bonded in non-co-firing applications, as well as in stand-alone substrate applications, where the multi-layer glass and/or ceramic substrate is bonded to, or installed in connection with, another member or device, as mentioned above. That is, is desirable to prevent thermal and mechanical stresses from arising when the final structure is used in the intended applications, which typically include temperature cycling environments.

For the reasons explained above, it would be desirable to provide a material for a multi-layer substrate that has a TEC that closely matches, or that can otherwise be easily tailored to match, that of the intended support core or base member to which the multi-layer substrate is to be joined or otherwise installed.

Most ceramic and glass materials that have a suitable TEC, however, do not also have a suitably low dielectric constant (K) and low loss tangent (or high Q factor), which makes these ceramic materials less desirable for high frequency electronic applications. Along those lines, most ceramic and glass materials having a suitably low dielectric constant and high Q factor do not have a suitable TEC, and in particular, the TEC often cannot be tailored to achieve a closer match to that of the base structure to which the multi-layer substrate is to be bonded.

It would be more desirable, therefore, to provide a multi-layer substrate material that has a desirable TEC along with desirable electrical properties, such as a very low dielectric constant (K) and a high Q factor, that is, 1/loss tangent.

In addition, it would also be desirable to provide a material for a multi-layer substrate that is sufficiently densified at relatively low sintering temperatures, e.g., at temperatures less than 950° C., and that can be suitably provided with, and co-fired with, relatively low melting-point, low resistance metals, such as Ag, Cu and such alloys, especially for LTCC-type applications. Most ceramic and some glass or glass-based materials, however, require significant heat-treatment at temperatures exceeding 950° C. in order to achieve sufficient densification and the desired electrical characteristics. When higher processing temperatures are involved, however, metals having a higher melting-point need to be used, especially for electronic applications that involve high frequencies (i.e., up to 60 GHz).

SUMMARY OF THE INVENTION

It is an object of the present invention to provide a glass-ceramic that is suitable for use as a multi-layer substrate in high frequency electronic packaging applications such as low temperature co-fired ceramic (LTCC) applications, co-fired ceramic on metal applications (i.e., a metal-ceramic substrate with wiring and attached active and passive circuit elements) and thin-film metallized glass-ceramic packages bonded to assemblies or substrates made of ceramic or metal, for example. It is also an object of the present invention to provide an electronic packaging assembly including such glass-ceramics. Additionally, it is an object of the present invention to provide a glass-ceramic material that is suitable for stand-alone substrate applications, such as a substrate with thin-film wiring, for use in high frequency electronic applications.

The glass-ceramic material according to the present invention has a thermal expansion coefficient in a range of 3-6 ppm/° C. This TEC range either closely matches, or can easily be tailored to better match, that of the desired support core or base material to which the multi-layer ceramic substrate is to be joined. The glass-ceramic material according to some embodiments of the present invention are sufficiently densified when sintered to a relatively low temperature of about 900-950° C., have a low dielectric constant of less than 5, preferably less than 4.75, and also has a very low loss tangent (i.e., a high Q factor of greater than 400, more preferably, greater than 500, and even more preferably, greater than 550).

When fired at higher sintering temperatures, and in some cases, with the addition of a high TEC additive such as quartz, the glass-ceramic material according to some embodiments of the present invention exhibits a very high Q, low K, and a slightly higher TEC in a range of 4-6 ppm/° C.

According to one embodiment of the present invention, a glass-ceramic is provided having a thermal expansion coefficient in a range of 3-6 ppm/° C., a dielectric constant in a range of less than 5 and a Quality factor Q of at least 400. The glass-ceramic of the present invention consists essentially of $SiO_2$ in a range of 45-58 wt %, $Al_2O_3$ in a range of 10-18 wt % and MgO in a range of 10-25 wt %. $SiO_2$, $Al_2O_3$, and MgO constitute the core composition. It is also preferred that the glass-ceramic further includes at least one of $B_2O_3$ in an amount up to 10 wt %, $P_2O_5$ in an amount up to 7 wt %, and up to 10 wt % $GeO_2$. Preferably, the composition of the glass-ceramic of the present invention contains 48-57 wt % $SiO_2$, 14-18 wt % $Al_2O_3$, and 18-25 wt % MgO.

The glass-ceramic according to several embodiments of the present invention include cordierite, cristobalite, quartz, or a combination of these phases, as a main crystal phase. In some cases, minor crystal phases of cristobalite, quartz, enstatite are also present. It should be noted, however, that when one phase is designated as the main phase, it is not also considered to be a minor phase. In the context of the present invention, the phrase "main crystal phase" refers to a crystal phase that is present in an amount that is greater than any other phase. Minor phases are crystal phases that are present in a lesser amount, which is typically less than about 25%. The presence of such main and minor crystal phases is determined by XRD analysis.

The glass-ceramic of the present invention can be provided in a powder or particulate form that can be easily processed. That is, the glass-ceramic can be easily processed into green multi-layer laminates by mixing the glass-ceramic powders with casting additives and tape casting the slurry into a green tape that can be made into a plurality of individual green sheets that can be provided with metallurgy, such as printed circuitry patterns, and then stacked (layered), laminated and heat-treated at a low temperature to remove organics and the like to form a green multi-layer structure. Other batching and forming methods, including but not limited to roll compaction methods, for example, can also be used to produce the green multi-layer structure. The green multi-layer structure can then be fired at a sintering temperature between 900 and about 1100° C., depending upon the particular composition and ultimate application, or alternatively, the green multi-layer structure can be prepared and adhered to a support core for co-firing applications.

The glass-ceramic according to the present invention can readily be used in a wide variety of high frequency electronic applications at frequencies up to about 60 gigahertz by virtue of the low dielectric constant and high Q factors. Since the glass-ceramic according to the present invention can be thermally processed and compositionally adjusted to have a desirable TEC range while maintaining the desirable high frequency electrical characteristics of a very low dielectric constant (K) and very high Q, it can be used in connection with a variety of members made of a variety of materials in both co-firing and non-co-firing applications. It should be noted, however, that non-co-firing applications are favored when the glass-ceramic is sintered at temperatures exceeding 1000° C. in order to achieve the desired electrical characteristics.

Examples of such members include metal cores or metal supports made of KOVAR® or Cu/Mo/Cu, for use in heat sink applications, for example. The glass-ceramic according to the present invention can also be bonded with active components, such as certain integrated circuits that are built, for example, on gallium arsenide or silicon bases, as well as other silicon substrates and gallium arsenide members.

Further, the glass-ceramic according to the present invention is also compatible with a variety of thin-film metals, including, but not limited to, Au, Ag, Al, Ni, Pt, Cu, Pd, Fe, Ti, Cr, and various alloys thereof, and thin-film processing techniques, such as sputtering and CVD, as well as thick-film processing and "personalization processing." Personalizing the green sheets prior to lamination can involve, for example, forming vias and filling the vias with suitable via pastes, and forming structural features to define cavities and the like in the final, laminated glass-ceramic substrate. Thick-film processing typically involves printing signal lines, ground planes and the like using conductive inks or pastes, for example. Thick-film personalization involving low melting-point metals such as Ag, Au and Cu can be applied to individual green sheets formed from the compositions according to several embodiments of the present invention and co-fired with the green laminated structure to relatively low temperatures less than 1050° C., more preferably, less than 950° C.

In some cases, however, the glass-ceramic of the present invention is more preferably sintered to temperatures between 1000° C. and 1100° C. Here, a metal or metal alloy having a higher melting-point than Ag (and in some cases, higher melting-point than Au and Cu) would be required in applications involving applying metallurgy to the green sheets or green laminated structure prior to sintering.

According to another embodiment of the present invention, an electronic package is provided, including a base member and a glass-ceramic substrate bonded to the metal base. The glass-ceramic substrate has a thermal expansion coefficient in a range of 3-6 ppm/° C., a dielectric constant in a range of less than 5 and a Quality factor (1/loss tangent) Q of at least 400. Preferably, the electronic package according to the present invention further comprises a bonding layer interposed between the metal base and the glass-ceramic substrate.

According to one embodiment of the present invention, the base member is a metal, such as KOVAR® or laminated Cu/Mo/Cu, and the bonding layer is one of a solder and a bond glass having an appropriately selected, and in this case, relatively low, softening-point, along with an appropriate working-point and TEC. According to another embodiment of the present invention, the base member is a ceramic member, such as a sintered AlN or $Al_2O_3$ member, and the bonding layer is one of a solder or a bond glass having an appropriately selected softening-point, working-point and TEC.

When the glass-ceramic substrate is sintered and the base member is a metal, as in some embodiments of the present invention, it is preferred that the sintered glass-ceramic substrate is metallized before being bonded with the metal core via a solder. Examples of suitable metallization are explained in more detail below in connection with the Examples. When the glass-ceramic substrate is green, that is, not sintered, before being bonded with the metal core, metallization is not required and the bonding layer is preferably an appropriate bond glass. One of ordinary skill in the art would be readily capable of selecting an appropriate bond glass for such an application, and the choice of bond glass used in connection with the present invention is not limited herein.

When the glass-ceramic substrate is sintered and the base member is a sintered ceramic, it is preferred that both the glass-ceramic substrate and sintered ceramic base member are metallized before being bonded via a solder. When a bond glass is used instead of a solder to form the bonding layer between a sintered glass-ceramic substrate and the sintered ceramic base member, metallization of the glass-ceramic substrate and sintered ceramic base member is not required, and the bond glass is preferably selected based on appropriate characteristics such as working-point, softening-point, and TEC. One of ordinary skill in the art would be readily capable of selecting an appropriate bond glass for such applications, and the choice of bond glass used in connection with the present invention is not limited herein. The present invention is not limited to soldering and bond glass joining methods, and other materials such as organic adhesives (e.g., epoxies, organic polymers, or organic adhesives including ceramic or metallic additives) could also be selected to join the glass-ceramic and the base member when bonding is performed under the appropriate heat-treatment conditions for the selected bonding material.

Likewise, when the glass-ceramic substrate is green (i.e., not sintered) before being bonded with the sintered ceramic base member, metallization is not required and the bonding layer is preferably an appropriately selected bond glass. Further, in some cases involving green substrates and sintered ceramic cores, an additional bonding agent may not be needed at all.

The glass-ceramic can also include a conductive pattern, formed in communication with at least one surface thereof, that is co-fired with the glass-ceramic substrate (i.e. green sheet or laminated structure personalization). Since the glass-ceramic according to some embodiments of the present invention achieves sufficient densification at low firing temperatures, conductive patterns and/or metallized regions can be formed on the green laminated body using a relatively low melting-point metal, such as Ag.

When a very high Q is desired, however, the glass-ceramic material according to some embodiments of the present invention is preferably sintered to a temperature closer to 1100° C. In this case, a higher melting-point metal would be required for pre-sintering metallization (i.e., personalization) of the glass-ceramic substrate.

The TEC of the glass-ceramic according to the present invention either matches or is easily adjusted to achieve a close TEC match with that of the support material to which the glass-ceramic substrate is bonded in high frequency electronic applications. For example, the $\alpha_{RT-300}$ of a non Ni-plated, laminated Cu/Mo/Cu metal core is about 5.3 ppm/° C., and the $\alpha_{RT-300}$ of the glass-ceramic material according to one embodiment of the present invention is 5.4 ppm/° C. (see Example 14). The close match ensures good bonding (e.g., via a solder when the glass-ceramic material is metallized) without thermal mismatch defects such as cracking or bowing at low temperatures.

When the TEC of the glass-ceramic material according to the present invention is significantly higher or lower than that of the material to which it is bonded, the TEC of the glass-ceramic can be easily adjusted by adding a TEC adjusting additive, such as cordierite, cristobalite, trydimite or quartz, to the glass-ceramic powder at the tape slurry preparation stage before forming the tapes that are laminated together to form the glass-ceramic substrate. Other TEC modifying agents, such as the glass-ceramic compositions shown in Examples 25 and 26, can also be added as particulates at the tape slurry preparation stage so long as the material has a crystal phase that has a desirably higher TEC compared to the glass-ceramic, a low K and a high Q, in order to retain these preferred characteristics in the mixture.

For example, according to one aspect of the present invention, and as shown in Examples 12-19 and 23, the glass-ceramic further includes 1-15 wt % of a crystalline silica material such as quartz (as in Examples 13, 15, 16, 18, 19 and 23), cristobalite or trydimite or, alternatively, another material that crystallizes to produce these phases, such as the composition of Example 25 used in Examples 14 and 17. The additive is provided as a particulate to the glass-ceramic material during the tape slurry preparation stage when the TEC of the base member would be higher than that of the un-modified glass-ceramic substrate. More preferably, 4-10 wt % of one of these TEC increasing additives is included. For example, certain borosilicate glasses, when prepared in the form of a powder, can also be added in an amount of 1 to 20 wt %, preferably 4-12 wt %, at the tape slurry preparation stage to adjust the properties of the glass-ceramic of the present invention.

In some cases, it may also be desirable to add a TEC reducing agent to lower the TEC of the glass-ceramic to better match that of a lower TEC member to which it is to be joined, or to positively affect the other properties of the glass-ceramic, such as K. In this case, an amount of fused silica, for example, preferably 1 to 15 wt %, is added to the glass-ceramic powder at the tape slurry preparation stage. Cordierite can also be added in an amount of 1 to 15 wt %, preferably 4-10 wt %, although it should be noted that while cordierite can lower the TEC, excessive additions can negatively affect the overall crystal structure of the glass-ceramic resulting in the formation of too much cordierite which leads to higher Ks and excessively low TECs.

Similarly, glasses or glass ceramics having a low K, high Q and relatively low TEC can also be added as particulates at the tape slurry preparation stage to desirably adjust the characteristics of the glass-ceramic of the present invention. For example, certain borosilicate glasses, when prepared in the form of a powder, can also be added in an amount of 1 to 20 wt %, preferably 4-12 wt %, at the tape slurry preparation stage to adjust the properties of the glass-ceramic of the present invention. An example of such a suitable borosilicate glass composition is shown in Example 27.

According to another embodiment of the present invention, a method of making a glass-ceramic substrate having a thermal expansion coefficient in a range of 3-6 ppm/° C., a dielectric constant of less than 5 and a Quality factor Q of at least 400 for use in high frequency electrical applications is provided. The method includes the steps of providing a glass-ceramic powder having an average particle size in a range of 1-20 μm and consisting essentially of $SiO_2$ in a range of 45-58 wt %, $Al_2O_3$ in a range of 10-18 wt % and MgO in a range of 10-25 wt %; combining the glass-ceramic powder with processing additives to form a slurry or dry mixture; forming a green body from the slurry or dry mixture; sintering the green body at a temperature in a range of 900-1150° C. for up to 6 hours to form a sintered glass-ceramic body; and cooling the sintered glass-ceramic body to form the glass-ceramic substrate.

The forming step preferably comprises a method selected from the group consisting of a doctor blade method, a roll compaction method, an extrusion method and a dry press method.

Preferably, the green body comprises a plurality of green sheets that are laminated under heat and pressure to form a laminated green multi-layer structure. It is also preferred that at least one of the green sheets is metallized, and that the metallized green sheet includes at least one of a structure selected from the group consisting of an electrode pattern, a conductive via, a cavity and a pattern made of at least one of a ceramic and a glass.

According to one aspect of the method according to the present invention, the sintering step is performed at a temperature of about 900° C. for 10 minutes. According to another aspect of the method according to the present invention, the sintering step is performed at a temperature of about 1000° C. for 1 hour. According to yet another aspect of the method according to the present invention, the sintering step is performed at a temperature of about 1100° C. for 3 hours.

The method according to the present invention can also include the steps of providing an additive consisting of a particulate material selected from the group consisting of a thermal expansion coefficient increasing additive and a thermal expansion coefficient reducing additive, the additive having a particle size in a range of 1-20 μm; and adding the additive to the glass-ceramic powder in the combining step.

According to one aspect of the method according to the present invention, the thermal expansion coefficient increasing additive comprises 1-15 wt % crystalline silica, which can preferably includes at least one of 4-10 wt % quartz, 4-10 wt % cristobalite and 4-10 wt % trydimite.

According to another aspect of the method according to the present invention, the thermal expansion coefficient increasing additive comprises 4-12 wt % of a borosilicate glass. According to yet another aspect of the method according to the present invention, the thermal expansion coefficient increasing additive comprises 1-15 wt % of a material having a composition consisting essentially of 50-55 wt % $SiO_2$, 12-18 wt % $Al_2O_3$, 10-18 wt % MgO and 4-16 wt % ZnO and having a primary crystal phase consisting of crystalline silica.

According to still another aspect of the method according to the present invention, the thermal expansion coefficient reducing additive comprises at least one of 4-12 w % of a borosilicate glass, 1-15 wt % cordierite and 1-15 wt % fused silica.

It should also be noted that the glass-ceramic according to the present invention is a true glass-ceramic material having a crystalline phase including a glassy intergranular phase matrix, not merely a ceramic-and-glass composite material made from a mixture of ceramics and glasses, as is the case with many prior art LTCC compositions.

BRIEF DESCRIPTION OF THE DRAWINGS

For a better understanding of the nature and objects of the present invention, reference should be made to the following detailed description of a preferred mode of practicing the invention, read in connection with the accompanying drawings and Examples, in which:

FIG. 2b is a cross-sectional view of the final ceramic packaging assembly of FIG. 2a;

FIG. 4b is a cross-sectional view of the final ceramic packaging assembly of FIG. 4a.

DETAILED DESCRIPTION OF THE INVENTION

Figure 1:
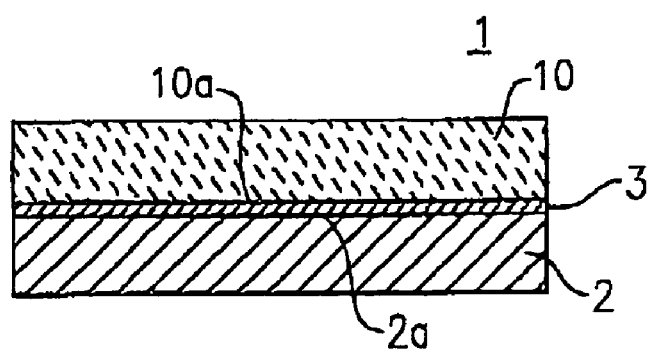
FIG. 1 is a cross-sectional view of a ceramic packaging assembly according to one embodiment of the present invention.

The glass-ceramic of the present invention consists essentially of $SiO_2$ in a range of 45-58 wt %, $Al_2O_3$ in a range of 10-18 wt % and MgO in a range of 10-25 wt %.

When more than about 58 wt % $SiO_2$ is added, the higher silica concentration makes the glass-ceramic difficult to melt, densify, and crystallize at relatively low temperatures below about 950° C., or even at temperatures less than 1100° C. When less than about 45 wt % $SiO_2$ is added, the lower silica concentrations tend to promote excessively rapid crystallization, crystallization at relatively low temperatures, reduces the tendency for stable glass-ceramic formation and tends to promote a higher TEC, a higher K and a lower Q, which is undesirable.

When more than about 18 wt % $Al_2O_3$ is added, the higher alumina concentration tends to result in more rapid crystallization, a higher cordierite level and higher TECs and Ks. When less than about 10 wt % $Al_2O_3$ is added, the lower alumina concentration levels result in a tendency to produce lower glass-ceramic formation and materials that crystallize rapidly (which are difficult to process successfully), a higher K, a higher TEC and a lower Q.

When more than about 25 wt % MgO is added, the higher magnesia concentration decreases the stability of glass-ceramic formation and can undesirably increase the crystallization rate, and increase K and the TEC. When less than about 10 wt % MgO is added, the lower magnesia concentration can lead to excessively refractory materials with high densification and crystallization temperatures, or an excessively high K and low Q, if other fluxing materials are used in addition to MgO.

Oxides of boron (i.e., $B_2O_3$), phosphorus (i.e., $P_2O_5$) and germanium ($GeO_2$) can also be provided as fluxing and glass-forming materials to assist in controlling the melting behavior and reducing the crystal growth rate for the glass-ceramic compositions according to the present invention. This provides a beneficial increase in the processing range (time-temperature-heating rate) and overall manufacturability of the glass-ceramic according to the present invention. If included, $B_2O_3$ is preferably provided in an amount of up to 10 wt %, and more preferably less than 5 wt %, and $P_2O_5$ is provided in an amount of up to 10 wt %, preferably less than 7 wt %, and more preferably less than 3 wt %. Similarly, if included, $GeO_2$ is preferably provided in an amount of up to 10 wt %, and more preferably 5 wt %, to achieve similar results, though $GeO_2$ tends to be a more expensive component and is thus slightly less desirable form that standpoint.

When provided in an amount up to 10 wt %, $B_2O_3$ desirably improves glass-ceramic formation, the tendency for successful glass melting, and the promotion of controllable crystallization rates and workable materials, as well as expands the compositional range for suitable/workable materials. $B_2O_3$ concentrations exceeding 10 wt %, however, can result in a higher K, lower Q and higher TEC, generally interfere with the development of the preferred crystalline phases, and can also prevent the use of BUT-VAR® as a tape binder, producing an undesirable gelling reaction.

Low levels of phosphorous pentoxide, i.e., to 3-7 wt %, function in a manner similar to the boron oxide in assisting in glass melting and providing a relatively stable glass-ceramic formation. At concentration levels higher than about 7 wt %, however, $P_2O_5$ tends to enhance the crystallization tendency and rates and can thus lead to poor control over devitrification and densification problems.

Germanium oxide additions are functionally analogous to boron oxide additions. Combinations of boron and germanium oxides or boron, phosphorus and germanium oxides can be very useful in controlling crystallization kinetics, as shown in the Examples herein.

Although BaO and SrO are not specifically present in the formulations according to the present invention, these materials can be present in small amounts to adjust the properties. In larger concentrations, however, BaO and SrO tend to produce Ba and Sr aluminosilicate phases that have relatively high dielectric constants. The presence of these components also tends to increase TEC, which in and of itself may not pose a significant problem. Zinc additions, such as ZnO, are also not present in the formulations according to the present invention, although it is less likely that zinc will result in the development of higher K phases and can therefore be useful in adjusting the characteristics of the glass-ceramic of the present invention.

As explained in more detail below, TEC modifying agents such as crystalline silica (e.g., quartz, trydimite and cristobalite) can also be added to the glass-ceramic composition powders of the present invention after at the slurry preparation stage increase the TEC of the glass-ceramic and produce a glass-ceramic substrate that has a TEC that more closely matches the TEC of the core or support member to which it is to be bonded. The glass-ceramic substrates of Examples 12-19 and 23 include TEC modifying additives that are added as a particulate at the tape slurry preparation stage.

Materials other than quartz and cordierite can also be used as TEC modifying agents to tailor the TEC of the glass-ceramic according to the present invention to more closely match that of the base material to which the glass-ceramic is to be bonded. For example, fused silica has a very low TEC of 0.5 ppm/° C., a low dielectric constant of 3.8 and a high Q exceeding 500, and can be favorably used to lower the TEC of the glass-ceramic instead of cordierite. Additionally, while quartz offers a very high TEC of 18 ppm/° C., a low dielectric constant of 4.2 and a high Q, other materials can also be used to increase the TEC of the glass-ceramic, such as the glass-ceramic of Examples 25 and 26, which, when processed at high temperatures, have a high TEC, low dielectric constant and very high Q.

The glass-ceramics according to the present invention are formed in the following manner. Raw materials, including oxides, hydroxides, peroxides and carbonates of the compositional components of the desired glass-ceramic composition are mixed (homogenized) and the mixture is placed in a Pt crucible, for example, which is then heated to a temperature of about 1400-1600° C. The molten glass-ceramic is rapidly cooled or quenched and pulverized into a glass-ceramic powder having an average particle size on the order of 1-15 µm. This glass-ceramic powder is suitable for processing green structures, e.g., multi-layer green sheet structures, which can be personalized, laminated, sintered, metallized and bonded to a support member or core at low temperatures (i.e., a non-co-firing application). The laminated green sheet structures can also be personalized, laminated and simultaneously sintered with a core material at higher temperatures (i.e., a co-firing situation).

A green multi-layer laminated structure is formed in the following manner. The glass-ceramic powder obtained as described above is combined with suitable processing additives, such as binders, solvents, plasticizers, dispersants and viscosity adjusters to produce mixture, such as a tape slurry. Examples of suitable processing additives include, but are not limited to, methyl and ethyl alcohol, toluene, MIBK, MEK (or water), BUTVAR® (polyvinyl butyral), or acrylic binders, di-butyl phathalate and fish oil.

In some instances, it may be desirable to add, for example, an additive consisting of 0.5-15 wt % cordierite or fused silica, preferably 2-10 wt % cordierite, as a particulate during the tape slurry preparation stage after the glass-ceramic is formed and pulverized into a powder but before green tapes are formed. This is preferred when the TEC of the base material to which the glass-ceramic is to be joined is lower than that of the glass-ceramic. In this case, for example, in the examples illustrated herein, that the TEC reducing additive has an average particle size of 0.1-20 µm, and in particular, that the added cordierite has an average particle size of 1 µm.

It should be noted that the particle size and amount of added cordierite, or another TEC reducing additive, are important when these additives are used as nucleating agents. For example, small amounts of cordierite may also be desired to assist in nucleating or otherwise promoting a cordierite phase in the glass-ceramic.

Alternatively, it may be desirable to add, for example, additives consisting of crystalline silica or a mixture of, for example, of crystalline silica and cordierite can be added as particulates during the tape slurry preparation stage. More preferably, cordierite is added in a range of up to 4 wt % and quartz is added in a range of up to 15 wt %. This is preferred when the TEC of the base material to which the glass-ceramic is to be joined is higher than that of the glass-ceramic. In this case, the TEC increasing additives according to the examples illustrated herein had an average particle size of 0.1-20 µm and in particular, the added quartz had an average particle size of 3 µm.

It should be noted that the particle size and amount of added quartz or another additive are important when these materials are used as nucleating agents. For example, small amounts of quartz or cristobalite may also be desired to assist in nucleating or otherwise promoting a crystalline silica phase in the glass-ceramic.

The tape slurry is tape cast using a doctor blade, for example, or any other suitable forming method, such as roll compaction, to form one or more green bodies (e.g., green tapes) having a thickness of about 8-12 mm. Green bodies could also be formed by dry pressing if the slurry forming step is omitted and the proper processing additives (i.e., those conducive to dry pressing) are added, and by roll compaction or extrusion if a plastic mass is made instead of a slurry by adding the appropriate processing additives to the glass-ceramic powder. The green tapes are cut into individual green sheets about 75 mm long and 75 mm wide, and a number of these green sheets, for example, 6, are stacked together to form a multi-layer green sheet structure.

The multi-layer green sheet structure is laminated under heat and pressure conditions. For example, the multi-layer green sheet structure is laminated at a temperature of 50-75° C. and a pressure of 100-500 psi, to form a green multi-layer laminated structure.

It should be noted that, prior to lamination, the individual green sheets can also be "personalized," or provided with a plurality of vias, or other structural features such as cavities, in any conventional manner, for example, by punching or milling. Additionally, conductive patterns can also be provided on the individual green sheets prior to stacking and laminating the multi-layer green sheet structure by printing or any other suitable method. As mentioned above, since some embodiments of the glass-ceramic of the present invention obtain a high density, even when fired at a relatively low firing temperatures of about 900° C., low melting-point metals such as Ag paste, for example, which has a relatively low melting-point of 962° C., can be used to metallized the substrate, or to form printed circuits on the individual sheets.

A sintered glass-ceramic substrate that is metallized for ceramic packaging applications in a non-co-firing situation is formed as follows. The green multi-layer laminated structure formed as described above is heated to a temperature of less than 500° C. to remove binders and organics in the like at a slow ramp rate of 2-3° C./min for approximately 10-60 minutes. If conductive pastes to form circuit patterns are provided prior to lamination by printing, for example, the metal of the conductive paste should be selected depending upon the temperature at which the green multi-layer laminated structure is to be sintered.

For example, in a low temperature application, the green multi-layer laminated structure is then fired at a faster ramp rate of 5-10° C./min to a temperature of about 900° C. and held for 10-15 minutes to densify and sinter the green multi-layer laminated structure to form a glass-ceramic substrate and to allow crystalline phases to develop in the glass-ceramic substrate. In this case, Ag, Cu and Au pastes, or pastes made from alloys of these materials, can be used for pre-sintering personalization.

The green multi-layer laminated structure could instead be fired at a faster ramp rate of 5-10° C./min to a temperature of about 950° C. to 1025° C. and held for 10-15 minutes, or up to several hours, if necessary or desired, to fully sinter and densify the green multi-layer laminated structure to form a glass-ceramic substrate and to allow the desired crystalline phases to develop in the glass-ceramic substrate. In this case, Cu and Au pastes, or pates made from alloys of these materials or alloys of AgPd and other refractory Ag alloys, can be used for pre-sintering personalization. It should be noted, however, that pure Ag pastes are not utilized when the firing temperatures exceed the melting point of un-alloyed silver.

Furthermore, the green multi-layer laminated structure could instead be fired at a faster ramp rate of 5-10° C./min to a temperature of about 1100° C. and held for 1-3 hours to sinter and fully densify the green multi-layer laminated structure to form a glass-ceramic substrate. Firing at this increased sintering temperature also allows the desired crystalline phases, such as cristobalite, quartz and trydimite, to further develop in the glass-ceramic substrate to provide an extremely high Q while maintaining the desired K and TEC, or, if desired, increasing the TEC.

It should be noted that adding a nucleating agent such as quartz at the tape slurry preparation stage, as mentioned above, can also be helpful in this regard with respect to promoting the formation of the desired crystalline phases. In this case, a metal having a higher melting-point than Ag, and possibly even higher than Au and Cu, should be selected for the conductive paste if pre-sintering personalization is provided.

In each of the cases mentioned above, after the sintered glass-ceramic substrate has cooled, the surfaces may be ground, if necessary, to achieve a desired substrate thickness, preferably 0.15-1 mm for electronic package applications, for example, and 0.15-4 mm for stand-alone substrate applications, and also to flatten out the substrate surfaces. After being ground to the desired thickness and flattened (if necessary), the glass-ceramic substrate is then metallized in preparation for solder bonding. That is, a thin film metal, such as Au or a sandwich of Ti—Ni—Au or alloys thereof, is applied to the surfaces of the glass-ceramic substrate by sputtering, for example.

It should be noted that other glass-ceramic substrate preparation options include providing a metallization pattern before sintering the green multi-layer substrate and omitting the grinding and post-sintering metallization step. Further, a green multi-layer laminated structure can be provided with a thick-film metal, sintered and then ground, if necessary, to achieve the desired flatness. If the grinding step is necessary, a thin film metal can thereafter be applied to the sintered glass-ceramic substrate. If the grinding step is not necessary, the thin film metal can be applied after the sintering step.

The metallized glass-ceramic substrate is then subjected to an etching process, such as photolithography or chemical etching, to form a pattern of solder bands. It should be noted that the positions of the solder bands preferably correspond to the outline of the perimeter of rectangular holes or other similar features that may be provided in the metal cores or sintered ceramic (or other) base members to which glass-ceramic substrate is bonded. Solder bands can also be formed using a post-sintering thick film metallization technique, such as printing, for example. In this case, however, photolithography or other etching processes may not be required. In addition, certain hybrid technologies, i.e., a combination of thick and thin-film processes, can be used to prepare the glass-ceramic substrate for solder bonding. For example, a thick-film (i.e., screen printed) metal blanket can be provided and then etched to form solder bands, or even circuit patterns, using thin-film processing techniques.

In cases where the core member is a metal, such as a non-Ni-plated, laminated Cu/Mo/Cu metal core, the metallized glass-ceramic substrate is positioned over a core member to form an assembly. In cases where the base member is a sintered ceramic, however, the sintered ceramic base member is also metallized in preparation for solder bonding, in the same manner as described above in connection with the metallization of the glass-ceramic, before the metallized glass-ceramic substrate is positioned over the sintered ceramic base member to form an assembly.

A solder material, such as an Au/Sn solder, is applied to the solder bands. The assembly is heated to a temperature of about 280° C. to reflow the solder and to form a bond between the glass-ceramic substrate and the metal core or sintered ceramic base member. Since the bonding temperature of the assembly is relatively low, that is, less than 300° C., it is important that the $\alpha_{RT\text{-}300}$ values for the glass-ceramic substrate and the metal core or sintered ceramic core closely match in this temperature range.

On the other hand, in co-fired ceramic packaging applications, the green multi-layer laminated structure is not sintered prior to being joined with the metal core or sintered ceramic base member, and although personalization metallization may be provided, the bonding surface of the green multi-layer laminated structure is not metallized as described above for the sintered glass-ceramic that is joined to a base member via solder. In co-firing applications where the support member is a metal core, such as a laminated Cu/Mo/Cu core, the surfaces of the Cu/Mo/Cu core may desirably be coated with Ni, for example, by plating. It should be noted, however, that the method for applying the Ni layer to the laminated Cu/Mo/Cu metal core is not limited to plating, and can also be formed by thin-film techniques, for example. The Ni-coated Cu/Mo/Cu core is heat-treated to a temperature of about 650-850° C. for 2-20 minutes to oxidize the Ni.

In cases where the base member is a sintered ceramic, however this Ni plating may not be necessary in order to provide a suitable bond between the glass-ceramic substrate and the sintered ceramic base member during heat treatment. Preferably, the bond glass mentioned below should adhere directly to the sintered ceramic base member without requiring Ni plating. It should be noted, however, that the above-described Ni plating process could, in fact, be used in connection with a sintered ceramic base member, as well as alternate metallization strategies, if needed.

A low softening-point bond glass paste is provided by screen printing, for example, onto the joining surface of the base member. When an oxidized, Ni-plated Cu/Mo/Cu core is used, the core is then heat-treated at a temperature of about 550-800° C. for 5-30 minutes to burn out the paste binders and organics and to flow the bond glass particles into a smooth, adherent film. When the support member is a sintered ceramic, an analogous procedure will produce an analogous structure.

In cases where the support member is a metal core, a binder, preferably the same binder that was used to form the green tapes (described above), is combined with an organic adhesive, such as MIBK or MEK with alcohol to form an organic adhesive, which is applied to the surface of the bond glass film on the joining surface of the Ni-coated Cu/Mo/Cu core. The green multi-layer laminated structure is positioned on the organic adhesive/glass film-coated surface of the Cu/Mo/Cu core to form an assembly. The assembly is then fired together to a temperature of about 900° C. for 10-15 minutes and then cooled. When the support member is a sintered ceramic, an analogous procedure will produce an analogous structure.

In the Examples detailed below, methods of forming the glass-ceramics according to the present invention are described in detail, and the thermal and electrical properties of the glass-ceramics are shown with respect to the different thermal cycles to which they were subjected when the green multi-layer laminated structures (formed from glass-ceramic powder as described above) were sintered at various sintering temperatures ranging from 900 to 1100° C. Suitable examples of ceramic packaging applications and methods of preparing these ceramic packages are also described in detail.

The thermal cycles are reported in terms of maximum times and temperatures. Dielectric constant (K) measurements were made using a Kent resonant fixture at a frequency of 10-15 gigahertz. Thermal expansion coefficients (TEC or $\alpha$) were measured using a commercial push-rod dilatometer (Theta, Inc.) and, unless otherwise noted, represent the average thermal expansion coefficient from room temperature to 300° C. X-Ray Diffraction (XRD) analysis was performed on the samples using a commercial unit manufactured by Philips and the data was obtained using MDI Datascan software with Phase ID analysis using MDI Jade 6.0 software.

It should be understood by those skilled in the art that the present invention is in no way limited to the examples described herein, and that variations and substitutions can be made without departing from the scope and spirit of the present invention.

EXAMPLE 1

A glass-ceramic having the composition shown in Table I was formed by batching and combining various oxides and carbonates (i.e., raw material forms) of each of the constituent components in the amounts shown. The raw material components were mixed (homogenized) and the mixture was placed in a Pt crucible, which was heated to a temperature of about 1500° C. for about 3 hours. The glass-ceramic was cooled and pulverized into a powder having an average particle size on the order of 8 μm.

EXAMPLE 2

A glass-ceramic powder having the composition shown in Table I was produced in the same manner as described above in connection with Example 1.

EXAMPLE 3

A glass-ceramic power having the composition shown in Table I was produced in the same manner described above in connection with Examples 1 and 2.

EXAMPLE 4

A glass-ceramic substrate was formed using the glass-ceramic powder from Example 1 in the following manner. The glass-ceramic powder of Example 1 was combined with an organic binder system including a BUTVAR®-based binder, fish oil, and methyl ethyl ketone (MEK), to form a tape slurry. The tape slurry was tape cast using a doctor blade to form green tapes having a thickness of about 10 mils (0.254 mm). The green tapes were cut into individual green sheets about 75 mm long and 75 mm wide, and six of these green sheets were stacked together to form a multi-layer green sheet structure. The multi-layer green sheet structure was laminated at a temperature of 85° C. and a pressure of 300 psi, to form a green multi-layer laminated structure. The green multi-layer laminated structure was slowly heated in a belt furnace at a ramp rate of about 2-3° C./min through a temperature range of about 100-400° C. to remove the binder(s), residual solvents and other organics. The ramp rate was then increased to 5-10° C./min to a temperature of about 900° C., which was held for 10-15 minutes to densify and sinter the green multi-layer laminated structure into a glass-ceramic substrate and to allow the crystalline phases to develop in the glass-ceramic substrate.

The characteristics of the glass-ceramic substrate produced according to Example 4 are shown in Table I. In addition, the glass-ceramic of Example 4 had a main crystal phase of cordierite and also included minor phases of enstatite, crystalline silica, and glass.

EXAMPLE 5

A glass-ceramic substrate was formed using the glass-ceramic powder from Example 2 in the same manner described above in connection with Example 4. In addition to the characteristics of the glass-ceramic substrate produced according to Example 5 that are shown in Table I, the glass-ceramic of Example 5 had a cordierite main crystal phase and minor phases including a cristobalite phase, a magnesium silicate phase and a glass phase.

EXAMPLE 6

A glass-ceramic substrate was formed using the glass-ceramic powder from Example 3 in the same manner described above in connection with Example 4. The characteristics of the glass-ceramic substrate produced according to Example 6 are shown in Table I. In addition, the glass-ceramic of Example 6 had a main crystal phase of cordierite as well as clinoenstatite and glass phases.

EXAMPLE 7

A glass-ceramic substrate was formed using the glass-ceramic powder from Example 1 in the same manner described above in connection with Example 4, with the exception of the sintering time and temperature. In Example 7, the sintering temperature was 950° C. and the hold time was 6 hours. The characteristics of the glass-ceramic substrate produced according to Example 7 are shown in Table I. In addition, the glass-ceramic of Example 7 had a cordierite main crystal phase and cristobalite and glass phases, as well.

EXAMPLE 8

A glass-ceramic substrate was formed using the glass-ceramic powder from Example 2 in the same manner described above in connection with Example 4, with the exception of the sintering time and temperature. In Example 8, the sintering temperature was 950° C. and the hold time was 6 hours. The characteristics of the glass-ceramic substrate produced according to Example 8 are shown in Table I. In addition to the characteristics of the glass-ceramic substrate produced according to Example 8 that are shown in Table I, the glass-ceramic of Example 8 had a cordierite main crystal phase and minor phases including a cristobalite phase, a clinoenstatite phase and a glass phase.

EXAMPLE 9

A glass-ceramic substrate was formed using the glass-ceramic powder from Example 3 in the same manner described above in connection with Example 4, with the exception of the sintering time and temperature. In Example 9, the sintering temperature was 950° C. and the hold time was 6 hours. The characteristics of the glass-ceramic substrate produced according to Example 9 are shown in Table I.

EXAMPLE 10

A glass-ceramic substrate was formed using the glass-ceramic powder from Example 1 in the same manner described above in connection with Example 4, with the exception of the sintering time and temperature. In Example 10, the sintering temperature was 1100° C. and the hold time was 3 hours. The characteristics of the glass-ceramic substrate produced according to Example 10 are shown in Table I. In addition to the characteristics of the glass-ceramic substrate produced according to Example 10, the glass-ceramic of Example 10 had a cordierite main crystal phase and minor phases including cristobalite and proto-enstatite.

EXAMPLE 11

A glass-ceramic substrate was formed using the glass-ceramic powder from Example 1 in the same manner described above in connection with Example 4, with the exception of the sintering time and temperature. In Example 11, the sintering temperature was 1100° C. and the hold time was 3 hours. The characteristics of the glass-ceramic substrate produced according to Example 11 are shown in Table I. In addition to the characteristics of the glass-ceramic substrate produced according to Example 11, the glass-ceramic of Example 11 had a cordierite main crystal phase and minor phases including cristobalite, quartz, magnesium silicate, and a small glassy phase.

EXAMPLE 12

A glass-ceramic substrate was formed using the glass-ceramic powder from Example 1 in the same manner described above in connection with Example 4, with the exception of the sintering time and temperature. In Example 12, the sintering temperature was 1100° C. and the hold time was 3 hours. The characteristics of the glass-ceramic substrate produced according to Example 12 are shown in Table I. In addition to the characteristics of the glass-ceramic substrate produced according to Example 12, the glass-ceramic of Example 12 had a cristobalite main crystal phase and minor phases of quartz, cordierite, enstatite and a small amount of a glassy phase.

EXAMPLES 13-19

Table I also shows the composition and properties of the glass-ceramics of Examples 13-19, which have the same compositions as the glass-ceramic of Examples 1-3 with the exception of the additives noted in Table I and explained in more detail below. In Examples 13-19, the glass-ceramic powders were prepared according to Example 4, and green multi-layer laminated structures were provided according the steps described in Example 4. In Examples 13-19, however, the green multi-layered laminated structures were each sintered at a temperature of 1100° C. with a 3 hour hold, as shown in Table I.

EXAMPLE 13

In Example 13, the composition was the same as that of Example 1 and further included an additive of 5 wt % quartz having an average particle size of 3 µm that was added at the tape slurry preparation stage. The characteristics of Example 13 are shown in Table I.

EXAMPLE 14

In Example 14, 8 wt % of a pulverized glass-ceramic material having the composition shown in Example 25 and an average particle size of about 8 µm was added to the glass-ceramic powder of Example 1 at the tape slurry preparation stage. The green multi-layered laminated structures were sintered were sintered at a temperature of 1100° C. with a 3 hour hold, as shown in Table I. The characteristics of the glass-ceramic of Example 14 are also shown in Table I.

As shown in Example 14, glass-ceramic powders having a composition such as the ones shown in Examples 25 and 26, for example, can be used as TEC modifying (i.e., increasing) agents as described above instead of quartz. That is, these compositions can be used as TEC increasing additives for lower temperature firing glass-ceramics if they are first fired at 1000° C.-1100° C. to crystallize into the high expansion phases and are then ground into a powder to be added to the glass-ceramic composition at the tape slurry preparation stage, as described above.

EXAMPLE 15

In Example 15, 5 wt % quartz having an average particle size of about 3 µm was added to the glass-ceramic powder of Example 2 at the tape slurry preparation stage. The green multi-layered laminated structures were sintered were sintered at a temperature of 1100° C. with a 3 hour hold, as shown in Table I. The characteristics of the glass-ceramics of Example 15 are shown in Table II.

EXAMPLE 16

In Example 16, 10 wt % quartz having an average particle size of about 3 µm was added to the glass-ceramic powder of Example 2 at the tape slurry preparation stage. The green multi-layered laminated structures were sintered were sintered at a temperature of 1100° C. with a 3 hour hold, as shown in Table I. The characteristics of the glass-ceramics of Example 16 are shown in Table I.

EXAMPLE 17

In Example 17, 8 wt % of the composition shown in Example 25 having an average particle size of about 8 µm was added to the glass-ceramic powder of Example 2 at the tape slurry preparation stage. The green multi-layered laminated structures were sintered were sintered at a temperature of 1100° C. with a 3 hour hold, as shown in Table I. The characteristics of the glass-ceramics of Example 17 are shown in Table I.

EXAMPLE 18

In Example 18, 5 wt % quartz having an average particle size of about 3 µm was added to the glass-ceramic powder of Example 2 at the tape slurry preparation stage. The green multi-layered laminated structures were sintered were sintered at a temperature of 1100° C. with a 3 hour hold, and the resultant characteristics of the glass-ceramic of Example 18 are shown in Table II.

EXAMPLE 19

In Example 19, 10 wt % quartz having an average particle size of about 3 µm was added to the glass-ceramic powder of Example 2 at the tape slurry preparation stage. The green multi-layered laminated structures were sintered were sintered at a temperature of 1100° C. with a 3 hour hold, as shown in Table I. The characteristics of the glass-ceramic of Example 19 are also shown in Table I.

EXAMPLES 20-23

Examples 20-23 have the modified compositions noted in Table I. In Examples 20-23, the glass-ceramic powders were prepared according to Example 4, and green multi-layer laminated structures were provided according the steps described in Example 4. In Examples 20-23, however, samples of each of the green multi-layered laminated structures were also sintered at a temperature of 1000° C. with a 1 hour hold, and samples of the of the green multi-layered laminated structures Examples 20-22 were also sintered to 1100° C. with a 3 hour hold, as shown in Table I.

No TEC adjusting additives were provided at the tape slurry preparation stage in Examples 20-22. Germanium oxide was included in the compositions of Examples 21 and 22, whereas $P_2O_5$ was not included in any of these Examples. $B_2O_3$ was present in the compositions of Examples 20 and 22, either alone or in combination with the $GeO_2$ as shown in Table I. In Example 23, 5 wt % quartz was added to the composition of Example 22.

EXAMPLES 20-23

Sintered at 900° C. for 10 Minutes

Table I shows that when the glass-ceramic of 20 was sintered at 900° C. for 10 minutes, the sintered glass-ceramic substrate had K of 5.15 and a low Q of 350. The TEC data for this Example was not obtained since the measured Q was too low. Similarly, when the glass-ceramic of Example 21 was sintered at 900° C. for 10 minutes, the resultant K of 6.0 was too high, and the Q of 90 was far too low. The TEC data for this Example was not obtained in view of this data. When the glass-ceramic of Example 22 was sintered at 900° C. for 10 minutes, the resultant K of 4.95 and Q of 440 were better than those of Examples 20 and 21, and the TEC data for this Example was 5.3 ppm/° C.

EXAMPLES 20-23

Sintered at 1000° C. for 1 Hour

Table 1 shows the results obtained when the samples of the glass-ceramics of Examples 20-23 were sintered at a temperature of 1000° C. for 1 hour. In Example 20, the TEC was measured to be about 4.5 ppm/° C., and the K of 4.8 was lower than that of the Example 20 sample fired at 900° C./10 minutes. Additionally, the Q of Example 20 increased to 730 when the green multi-layered laminated structure was sintered at 1000° C. for 1 hour.

When the glass-ceramic of Example 21 was sintered at 1000° C. for 1 hour, the TEC was measured to be about 6 ppm/° C., and the K of 5.0 was lower than that of the Example 21 sample fired at 900° C./10 minutes. Additionally, the Q of Example 21 increased to 1140 when the green multi-layered laminated structure was sintered at 1000° C. for 1 hour. This is a significant increase over the undesirable Q of 90 seen when the Example 21 sample was only fired to 900° C./10 minutes. The data is shown in Table I.

When the glass-ceramic of Example 22 was sintered at 1000° C. for 1 hour, the TEC was measured to be about 4.5 ppm/° C., and the K of 4.6 was lower than that of the Example 22 sample fired at 900° C./10 minutes. Additionally, the Q of Example 22 increased to 800. The data is shown in Table I.

When the glass-ceramic of Example 23 was sintered at 1000° C. for 1 hour, the TEC was measured to be about 4 ppm/° C., and the K of 4.7 was lower than that of the Example 23 sample fired at 900° C./10 minutes. Additionally, the Q of Example 22 increased to 650. The data is shown in Table I.

EXAMPLES 20-22

Sintered at 1100° C. for 3 Hours

Table I also shows that when the glass-ceramic of Example 20 was sintered at 1100° C. for 3 hours, the sintered glass-ceramic substrate had K of 4.75 and a high Q of 900. In addition, the TEC of the glass-ceramic substrate of Example 20 sintered at 1100° C. for 3 hours was 3.3 ppm/° C.

When the glass-ceramic of Example 21 was sintered at 1100° C. for 3 hours, the sintered glass-ceramic substrate had K of 5.2 and a very high Q of 1240, and a TEC of 5.6 ppm/° C. When the glass-ceramic of Example 22 was sintered at 1100° C. for 3 hours, the sintered glass-ceramic substrate had K of 4.6 and a high Q of 950, and a TEC of 3.9 ppm/° C.

The marked improvement of K and Q seen when the samples of Examples 21-22 were fired at 1100° C. for 3 hours instead of 900° C. for 10 minutes is believed to be attributed to the crystal phases that developed during the longer, hotter sintering period. Thus, in addition to the specific compositions of the present invention, in some cases, the sintering times and temperatures also play a critical role in obtaining the desired TEC, Q and K values.

COMPARATIVE EXAMPLE 24

A glass-ceramic substrate having the composition shown in Table I was produced according to the steps outlined in Example 4. XRD analysis indicated that anorthite (CaO—$Al_2O_3$-$2SiO_2$) was the primary crystal phase for this comparative example composition. The high frequency loss properties of anorthite are known to be inferior to those of the primary crystal phases present in the above-described glass-ceramic compositions of Examples 1-3 and 20-22, for example.

As shown in Table I, the glass-ceramic of the Comparative Example 24 had an extremely low Q value of 135, which is far below the desired Q of at least 400.

EXAMPLES 25-27

The compositions of the glass-ceramic materials of Examples 25-27 are shown in Table I. The material of Example 25 was formed into a glass-ceramic powder as described above in connection with Example 1. More specifically, the material of Example 25 was heated to temperatures exceeding 1000° C. during the heat treating step, quenched, ground and then added to the glass-ceramic of Examples 14 and 17 at the tape slurry preparation stage, as described in detail above.

The compositions of Examples 25 and 26 can be used as TEC modifying agents, and also beneficially increase the Q, when the compositions are heat treated to ensure that the resultant powders have the desired crystalline phases of cristobalite and/or quartz to adjust the TEC of the glass-ceramic compositions to which they are provided as additives.

Example 27 is an example of a borosilicate glass composition that can be added as a powder to the glass-ceramic composition according to the present invention during the tape slurry preparation stage in order to improve the overall sintering behavior of the glass-ceramic and to help reduce the K and increase the Q of the resultant glass-ceramic. Additionally, the addition of certain borosilicate glasses aids in obtaining a glass-ceramic that has an increased density.

When borosilicate glasses are chosen as additives, the specific glass composition should be selected based on a low K, a high Q, and viscosity characteristics that allow the glass to have adequate flow properties at temperatures between 800 and 1100° C., but which are suitable rigid at temperatures below 450° C.

In view of the foregoing Examples, it can be taken that he following materials can be suitably fired at temperatures below 950° C. and are thus capable of being co-fired with (pure) silver metallurgy, as well as Au, Cu or alloys of Ag, of Au or of Cu: Example 6; Example 9; Example 22 (@900° C./10 min); and Example 23 (@900° C./10 min.). Further, the glass-ceramics of Examples 20-23 are capable of co-firing with Au, Cu or alloys of Au or of Cu at temperatures of about 1000° C. for 1 hour: Example 20 (@1000C/1hr); Example 21 (@1000C/1hr); Example 22 (@1000C/1hr); and Example 23 (@1000C/1hr).

In addition to the information in Table 1, the main and minor crystal phases of some of the Examples are shown below:

Example 4: Cordierite, enstatite, crystalline silica and glass;
Example 7: Cordierite, cristobalite, and a small amount of glass;
Example 10: Cordierite, cristobalite and proto-enstatite;
Example 5: Cordierite, cristobalite, magnesium silicate, and low glass;
Example 8: Cordierite, cristobalite, clinoenstatite, and very low glass;
Example 11: Cordierite, cristobalite, quartz, magnesium silicate, and very low glass;
Example 2 plus 10% quartz sintered at 900° C./10 min: Cordierite, quartz, cristobalite, clinoenstatite, and low glass;
Example 16: Cristobalite, cordierite, magnesium silicate, and very low glass;
Example 3: Cordierite, glass and clinoenstatite;
Example 12: Cristobalite and quartz, cordierite, enstatite, and very low glass; and
Example 19: Cristobalite and quartz, cordierite, enstatite, and very low glass.

In the qualitative XRD analysis performed, the presence of glass can be identified by a broad or diffuse peak of generally lower intensity and occurring at lower angles, which is distinct from the sharp and frequently high intensity peaks for dominant crystalline phases.

TABLE I

| Composition | Example 1 | Example 2 | Example 3 | Example 4 | Example 5 | Example 6 | Example 7 |
|---|---|---|---|---|---|---|---|
| $SiO_2$ | 54.65 | 56.60 | 54.52 | Same as Example 1 | Same as Example 2 | Same as Example 3 | Same as Example 1 |
| $Al_2O_3$ | 17.50 | 17.15 | 17.30 | | | | |
| MgO | 24.21 | 20.34 | 22.22 | | | | |
| $P_2O_5$ | 2.44 | 2.38 | 2.40 | | | | |
| $B_2O_3$ | 1.20 | 3.53 | 3.56 | | | | |
| $GeO_2$ | — | — | — | | | | |
| ZnO | — | — | — | | | | |
| CaO | — | — | — | | | | |
| Additive | — | — | — | — | — | — | — |
| Properties: | | | | | | | |
| 900° C./10 min | | | | | | | |
| $\alpha_{(RT-300)}$ | | | | 4.5 | 3.1 | 3.3 | |
| K | | | | 5.35 | 4.77 | 5.05 | |
| Q | | | | 350 | 525 | 435 | |
| 950° C./6 hr | | | | | | | |
| $\alpha_{(RT-300)}$ | | | | | | | 4.5 |
| K | | | | | | | 5.38 |
| Q | | | | | | | 435 |
| 1000° C./1 hr | | | | | | | |
| $\alpha_{(RT-300)}$ | | | | | | | |
| K | | | | | | | |
| Q | | | | | | | |
| 1100° C./3 hr | | | | | | | |
| $\alpha_{(RT-300)}$ | | | | | | | |
| K | | | | | | | |
| Q | | | | | | | |

| Composition | Example 8 | Example 9 | Example 10 | Example 11 | Example 12 | Example 13 |
|---|---|---|---|---|---|---|
| $SiO_2$ | Same as Example 2 | Same as Example 3 | Same as Example 1 | Same as Example 2 | Same as Example 3 | Same as Example 1 |
| $Al_2O_3$ | | | | | | |
| MgO | | | | | | |
| $P_2O_5$ | | | | | | |
| $B_2O_3$ | | | | | | |
| $GeO_2$ | | | | | | |
| ZnO | | | | | | |
| CaO | | | | | | |
| Additive | — | — | — | — | — | 5 wt % Quartz |

TABLE I-continued

| Properties: | | | | | | | |
|---|---|---|---|---|---|---|---|
| 900° C./10 min | | | | | | | |
| $\alpha_{(RT-300)}$ | | | | | | | |
| K | | | | | | | |
| Q | | | | | | | |
| 950° C./6 hr | | | | | | | |
| $\alpha_{(RT-300)}$ | 2.9 | 3.6 | | | | | |
| K | 4.75 | 5.02 | | | | | |
| Q | 5.18 | 435 | | | | | |
| 1000° C./1 hr | | | | | | | |
| $\alpha_{(RT-300)}$ | | | | | | | |
| K | | | | | | | |
| Q | | | | | | | |
| 1100° C./3 hr | | | | | | | |
| $\alpha_{(RT-300)}$ | | | | 4.6 | 4.1 | 5.3 | 5.2 |
| K | | | | 4.85 | 4.31 | 4.88 | 4.8 |
| Q | | | | 1150 | 480 | 683 | 1125 |

| Composition | Example 14 | Example 15 | Example 16 | Example 17 | Example 18 | Example 19 | Example 20 |
|---|---|---|---|---|---|---|---|
| SiO₂ | Same as | Same as | Same as | Same as | Same as | Same as | 55.20 |
| Al₂O₃ | Example | Example | Example | Example | Example | Example | 17.51 |
| MgO | 1 | 2 | 2 | 2 | 3 | 3 | 22.49 |
| P₂O₅ | | | | | | | — |
| B₂O₃ | | | | | | | 4.80 |
| GeO₂ | | | | | | | — |
| ZnO | | | | | | | — |
| CaO | | | | | | | — |
| Na₂O | | | | | | | — |
| K₂O | | | | | | | — |
| Li₂O | | | | | | | — |
| Additive | 8 wt % Example 25 | 5 wt % Quartz | 10 wt % Quartz | 8 wt % Example 25 | 5 wt % Quartz | 10 wt % Quartz | — |
| Properties: | | | | | | | |
| 900° C./10 min | | | | | | | |
| $\alpha_{(RT-300)}$ | | | | | | | — |
| K | | | | | | | 5.15 |
| Q | | | | | | | 350 |
| 950° C./6 hr | | | | | | | |
| $\alpha_{(RT-300)}$ | | | | | | | |
| K | | | | | | | |
| Q | | | | | | | |
| 1000° C./1 hr | | | | | | | |
| $\alpha_{(RT-300)}$ | | | | | | | 4.5 |
| K | | | | | | | 4.8 |
| Q | | | | | | | 730 |
| 1100° C./3 hr | | | | | | | |
| $\alpha_{(RT-300)}$ | 5.4 | 5.8 | 7.6 | 4.9 | 7.4 | — | 3.3 |
| K | 4.5 | 4.5 | 4.0 | 4.8 | 4.3 | 4.5 | 4.75 |
| Q | 975 | 650 | 470 | 600 | 530 | 400 | 900 |

| Composition | Example 21 | Example 22 | Example 23 | Comparative Example 24 | Example 25 | Example 26 | Example 27 |
|---|---|---|---|---|---|---|---|
| SiO₂ | 53.91 | 49.55 | Same as | 52.98 | 53.81 | 53.39 | 72.0 |
| Al₂O₃ | 17.10 | 16.99 | Example | 16.96 | 15.74 | 14.00 | 1.0 |
| MgO | 21.97 | 21.82 | 22 | 15.64 | 12.45 | 16.28 | — |
| P₂O₅ | — | — | | 2.36 | 2.19 | 4.59 | — |
| B₂O₃ | — | 4.67 | | 1.17 | 3.24 | 4.51 | 25.0 |
| GeO₂ | 7.02 | 6.97 | | — | — | — | — |
| ZnO | — | — | | — | 12.57 | 7.23 | — |
| CaO | — | — | | 10.89 | — | — | — |
| Na₂O | — | — | | — | — | — | 0.5 |
| K₂O | — | — | | — | — | — | 1.0 |

TABLE I-continued

| | | | | | | | |
|---|---|---|---|---|---|---|---|
| Li$_2$O | — | — | — | — | — | — | 0.5 |
| Additive | — | — | 5 wt % Quartz | — | — | — | |
| Properties: | | | | | | | |
| 900° C./10 min | | | | | | | |
| $\alpha_{(RT-300)}$ | — | 5.3 | <5 | 4.8 | 3.2 | | |
| K | 6.0 | 4.95 | 4.85 | 6.52 | — | | |
| Q | 90 | 440 | 400 | 135 | — | | |
| 950° C./6 hr | | | | | | | |
| $\alpha_{(RT-300)}$ | | | | | | | |
| K | | | | | | | |
| Q | | | | | | | |
| 1000° C./1 hr | | | | | | | |
| $\alpha_{(RT-300)}$ | ~6 | 4.5 | ~4 | | | | |
| K | 5.0 | 4 | | | | | |
| .6 | 4.7 | | | | | | |
| Q | 1140 | 800 | 650 | | | | |
| 1100° C./3 hr | | | | | | | |
| $\alpha_{(RT-300)}$ | 5.6 | 3.9 | | | 22 | | |
| K | 5.2 | 4.6 | | | — | | |
| Q | 1240 | 950 | | | — | | |

CERAMIC PACKAGING ASSEMBLY EXAMPLES

EXAMPLE 28

Non-Co-fired Ceramic Packaging Assembly with Metal Base Member

A non-co-fired ceramic packaging assembly is formed in the following manner. The glass-ceramic substrate of Example 13 is prepared as described above. After the glass-ceramic substrate is ground to the desired thickness and flattened, a thin film metal of Ti—Ni—Au is applied to the surfaces of the sintered glass-ceramic substrate by sputtering.

A dry photo resist is laminated to the metallized substrate, exposed and developed under standard processing procedures to provide a protective mask over the metal. The exposed portions of the metal are removed using commercial etchants and procedures, and the photo resist is etched away to form a pattern of discrete solder bands on the substrate. A solder material comprising an 80/20 Au/Sn eutectic mixture is applied to the solder bands as a screened paste, and the metallized glass-ceramic substrate is positioned over a KOVAR® metal core that is either oxidized according to standard industry practices or plated with a thin layer of Ni and Au to prevent Cu oxidation and to provide a clean surface for the solder band. It should be noted that, in this case, the metal core is plated with a very thin layer of Ni, having a thickness on the order of 1.3 μm, and then a very thin layer of Au, having a thickness on the order of 0.13 μm, is applied by immersion on both sides. Since the Ni and Au layers are very thin, these layers have little to no impact on the TEC of the metal core.

In cases where a bond glass is used to bond the glass-ceramic substrate and a metal core, however, the metal core is either oxidized by standard industry procedures or plated with a thicker layer of Ni and oxidized, which does affect the TEC of the core. The assembly is heated to a temperature of 280° C. to reflow the solder and to form a bond between the glass-ceramic substrate and the metal core.

EXAMPLE 29

Non-Co-fired Ceramic Packaging Assembly with Sintered Ceramic Base Member

The glass-ceramic substrate of Example 10 or 11 is prepared as described above. The glass-ceramic substrate is then ground to the desired thickness and flattened, and a thin film metal of Ti—Ni—Au is applied to the surfaces of the sintered glass-ceramic substrate by sputtering. A dry photo resist is laminated to the metallized substrate, exposed and developed under standard processing procedures to provide a protective mask over the metal. The exposed portions of the metal are removed using commercial etchants and procedures, and the photo resist is etched away to form a pattern of discrete solder bands on the substrate. A solder material comprising an 80/20 Au/Sn eutectic mixture is applied to the solder bands as a screened paste, and the metallized glass-ceramic substrate is positioned over a sintered ceramic base member made of AlN, having a TEC of 4.5 ppm/° C., which is also metallized in the same manner as the glass-ceramic substrate. The assembly is heated to a temperature of 280° C. to reflow the solder and to form a bond between the glass-ceramic substrate and the metal core.

EXAMPLE 30

Co-fired Ceramic Packaging Assembly with Metal Base Member

A co-fired ceramic packaging assembly is produced in the following manner. A glass-ceramic powder having the composition of Example 22, or, alternatively, Example 23, is used to produce a green multi-layer laminated structure as described in Example 4. The Example 22 composition is compatible with thick film Ag, Au or Cu (or alloys) patterning. Unlike the metallized glass-ceramic substrate of Example 28, however, the green multi-layer laminated structure of Example 30 is not sintered or metallized for soldering prior to being joined with the metal core.

A KOVAR® core as in Example 28 is provided as a metal core member. In Example 30, however, the surfaces of the KOVAR® core are coated with Ni by plating. The KOVAR® core is heat-treated to a temperature of 800° C. for 30 minutes to oxidize the Ni.

A low softening-point bond glass paste having a green thickness of about 0.5-2 mils is screen printed onto the joining surface of the KOVAR® core, and heat-treated at a temperature of about 800° C. for 30 minutes to burn out the paste binders and organics and to flow the bond glass particles into a smooth, adherent film about 0.2-1.5 mils thick.

The same binder used to form the green tapes (described above in connection with Example 4) i.e., polyvinyl butyral, is combined with a methanol/MEK solvent, and the resultant organic adhesive is applied to the surface of the bond glass layer to form a film less than 1 mil thick on the joining surface of the KOVAR® core. The thickness of the organic adhesive film is not critical so long as it is sufficient to compensate for differences in the surface structures of the multi-layer laminated structure and the bond glass-coated core.

The green multi-layer laminated structure is positioned on the organic adhesive/glass film-coated surface of the core, and laminated/adhered to the core to form an assembly. The assembly is then simultaneously fired to a temperature of between 900° C. and 950° C. and cooled.

It should be noted that the Example 20 and Example 21 compositions can also be processed with the other core materials mentioned above in connection with Example 30 and laminated Cu/Mo/Cu core materials in co-firing situations, as well as with thick film Au or Cu or alloys, at somewhat higher temperatures near 1000° C. These applications would, however, require bond glasses having somewhat higher softening-points than those used in the lower firing temperature Examples. One skilled in the art would not have any difficulty in establishing which glasses might be appropriately as the bond glasses in these cases.

EXAMPLE 31

Co-fired Ceramic Packaging Assembly with Sintered Ceramic Base Member

A co-fired ceramic packaging assembly is produced in the following manner. A glass-ceramic powder having the composition of Example 20 is used to produce a green multi-layer laminated structure as described in Example 4. Unlike the metallized glass-ceramic substrate of Examples 28 and 29, however, the green multi-layer laminated structure of Example 31 is not sintered or metallized for soldering prior to being joined with the metal core.

A sintered ceramic base member made of AlN is provided. A bond glass having a softening-point in a range of 700-900° C. and a working point in a range of 850-1050° C. is formed into a paste having a green thickness of about 0.5-2 mils that is screen printed onto the joining surface of the AlN core, and heat-treated at a temperature of about 900° C. for 30 minutes to burn out the paste binders and organics and to flow the bond glass particles into a smooth, adherent film about 0.2-1.5 mils thick.

The same binder used to form the green tapes (described above in connection with Example 4) i.e., polyvinyl butyral, is combined with a methanol/MEK solvent, and the resultant organic adhesive is applied to the surface of the bond glass layer to form a film less than 1 mil thick on the joining surface of the AlN core. The thickness of the organic adhesive film is not critical so long as it is sufficient to compensate for differences in the surface structures of the multi-layer laminated structure and the bond glass-coated core.

The green multi-layer laminated structure is positioned on the organic adhesive/glass film-coated surface of the core, and laminated/adhered to the core to form an assembly. The assembly is then simultaneously fired to a temperature of about 1000° C. for 1 hour and cooled.

If, on the other had, a ceramic packaging assembly is made using an sintered $Al_2O_3$ base member instead of a sintered AlN base member, an appropriately selected bond glass would preferably have a softening-point in a range of 700-950° C. and a working point in a range of 850-1100° C. In this case, the bond glass is formed into a paste having a green thickness of about 0.5-2 mils that is screen printed onto the joining surface of the $Al_2O_3$ core, and heat-treated at a temperature of about 950° C.-1000° C. for 30 minutes to burn out the paste binders and organics and to flow the bond glass particles into a smooth, adherent film about 0.2-1.5 mils thick. After the organic adhesive is applied, the green multi-layer laminated structure is positioned on the organic adhesive/glass film-coated surface of the glassed $Al_2O_3$ core, and laminated/adhered to the $Al_2O_3$ core to form an assembly. The assembly is then simultaneously fired to a temperature of about 1100° C. for 0.5 to 3 hours and cooled.

FIG. 1 is a cross-sectional view of a ceramic packaging assembly 1 according to one embodiment of the present invention, specifically, a metallized multi-layer glass-ceramic substrate 10 that is solder bonded to a metal core 2. The ceramic packaging assembly 1 of FIG. 1 includes a glass-ceramic substrate 10, a metal core 2, and a bonding layer 3 disposed between the glass-ceramic substrate 10 and the metal core 2. The ceramic packaging assembly of FIG. 1 can be produced according to Examples 4 as described above, wherein a green multi-layer laminated structure (not shown in FIG. 1) having the composition of composition of Example 22 is sintered to 900° C. for 10 minutes to achieve sufficient densification of the laminated glass-ceramic green sheet layers to produce the glass-ceramic substrate 10 having the desired Q, K and TEC characteristics.

The glass-ceramic substrate 10 is then metallized and etched to define solder bands at least on the joining surface 10a thereof, as described in Example 28. An Au/Sn solder is provided on the solder bands, and the joining surface 10a of the glass-ceramic substrate is brought into contact with the joining surface 2a of the laminated Cu/Mo/Cu metal core 2. The assembly is then heated to a temperature of about 280° C. to reflow the solder and define the bonding layer 3, which joins the glass-ceramic substrate 10 and the metal core 2 at the interface between the respective joining surfaces 10a and 2a thereof to form the ceramic packaging assembly 1.

Figure 2A:
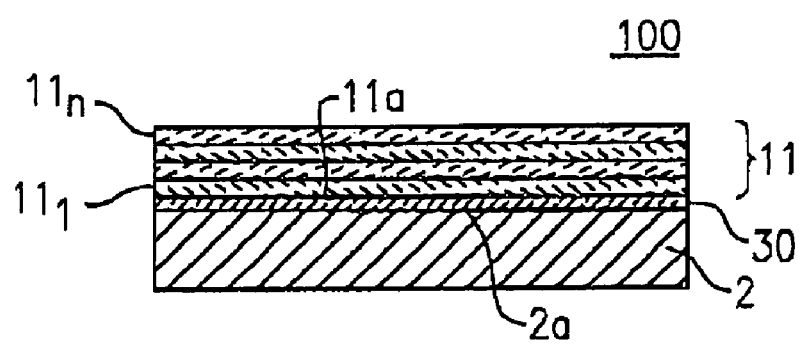
FIG. 2a is a cross-sectional end view of an intermediate stage in preparing an a ceramic packaging assembly according to another embodiment of the present invention.
Figure 2B:
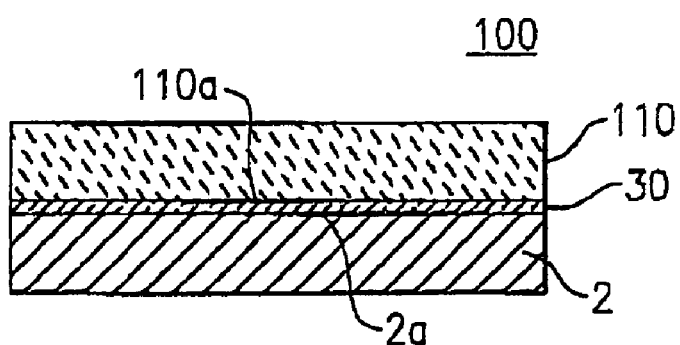

FIG. 2a is a cross-sectional view of an intermediate step in producing a ceramic packaging assembly 100 according to another embodiment of the present invention, specifically involving an un-metallized, green multi-layer laminated structure 11 that is bonded to a Ni-plated metal core 2 via a bond glass layer 30, as described above in Example 30. FIG. 2b is a cross-sectional end view of the final ceramic packaging assembly 100 of FIG. 2a.

As described above in connection with the Examples, after the glass-ceramic powder of Example 22 is prepared. A tape slurry is formed, and a plurality of green sheets are formed as described above in connection with Example 30. The green sheets $11_1 \ldots 11_n$ are cut, stacked, and laminated to form the green multi-layer laminated structure 11 of FIG. 2a in the manner described in Example 4.

As described in more detail above, and particularly in connection Example 30, the laminated Cu/Mo/Cu core 2 is plated with Ni, oxidized, and a layer of bond glass paste is printed, or otherwise suitably provided, on the joining surface 2a thereof. The bond glass paste is heated to remove organic constituents and to flow into a smooth, adherent bond glass film on the joining surface 2a of the Ni-plated metal core 2. An organic adhesive, such as that described in Example 30, is applied to the bond glass film, and the green laminated structure 11 is disposed so that the joining surface 11a contacts the organic adhesive/bond glass layers on the joining surface 2a of the Ni-coated Cu/Mo/Cu core 2.

The assembly is then heated to a temperature of about 900° C. for 10 minutes to densify the glass-ceramic layers of the green multi-layer laminated structure 11 into the glass-ceramic substrate 110 of FIG. 2b and to allow the bond glass layer 30 to react with and bond to the glass-ceramic substrate 110 and the metal core 2 as described above. The glass-ceramic substrate 110 is thus firmly bonded to the Ni-plated, laminated Cu/Mo/Cu core 2 via a bond glass layer 30 interposed between the respective joining surfaces 110a and 2a of the glass-ceramic substrate 110 and the metal core 2 to form the ceramic packaging assembly 100.

Figure 3:
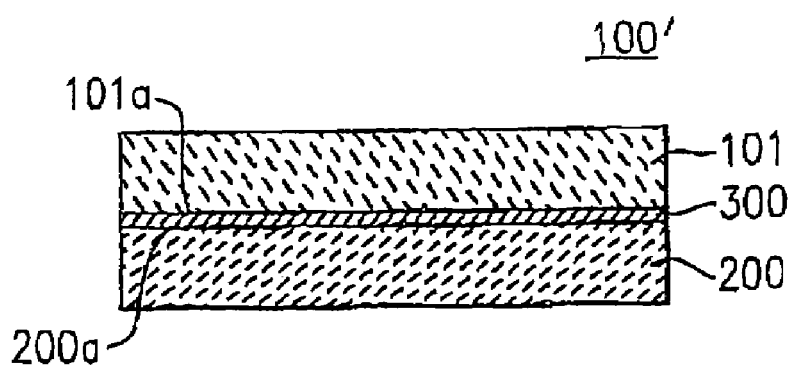
FIG. 3 is a cross-sectional view of a ceramic packaging assembly according to another embodiment of the present invention.

FIG. 3 is a cross-sectional view of a ceramic packaging assembly 100' according to one embodiment of the present invention, specifically, a metallized multi-layer glass-ceramic substrate 101 that is solder bonded to an AlN base member 200 via a bonding layer 300 that is disposed between the glass-ceramic substrate 101 and the AlN base member 200. The ceramic packaging assembly of FIG. 3 can be produced according to Example 4 as described above, wherein a green multi-layer laminated structure (not shown in FIG. 3) having the composition of Example 22 is sintered to 1000° C. for 1 hour to achieve sufficient densification of the laminated glass-ceramic green sheet layers to produce the glass-ceramic substrate 101 having the desired Q, K and TEC characteristics.

The glass-ceramic substrate 101 is then metallized and etched to define solder bands at least on the joining surface 101a thereof, as described in Example 29. An Au/Sn solder is provided on the solder bands, and the joining surface 101a of the glass-ceramic substrate is brought into contact with the joining surface 200a of AlN base member 200. The assembly is then heated to a temperature of about 280° C. to reflow the solder and define the bonding layer 300, which joins the glass-ceramic substrate 101 and the AlN base member 200 at the interface between the respective joining surfaces 101a and 200a thereof to form the ceramic packaging assembly 100'.

Figure 4A:
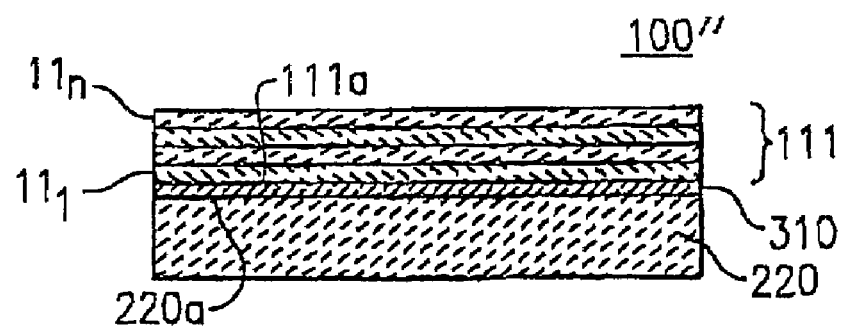
FIG. 4a is a cross-sectional end view of an intermediate stage in preparing an a ceramic packaging assembly according to another embodiment of the present invention.
Figure 4B:
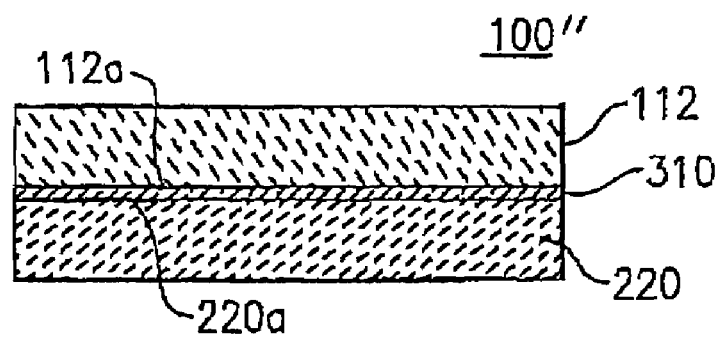

FIG. 4a is a cross-sectional view of an intermediate step in producing a ceramic packaging assembly 100" according to another embodiment of the present invention, specifically involving an un-metallized, green multi-layer laminated structure 111 that is bonded to a sintered ceramic core 220 via a bond glass layer 310, as described above in Example 31. FIG. 4b is a cross-sectional end view of the final ceramic packaging assembly 100" of FIG. 4a.

As described above in connection with the Examples, after the glass-ceramic powder of Example 22 is prepared. A tape slurry is formed, and a plurality of green sheets are formed as described above in connection with Example 4. The green sheets $11_1 \ldots 11_n$ are cut, stacked, and laminated to form the green multi-layer laminated structure 111 of FIG. 4a in the manner described in Example 4.

As described in more detail above, and particularly in connection Example 31, the sintered ceramic core 220 is provided and a layer of bond glass paste is printed, or otherwise suitably provided, on the joining surface 220a thereof. The bond glass paste is heated to remove organic constituents and to flow into a smooth, adherent bond glass film on the joining surface 220a of the AlN core 220. An organic adhesive, such as that described in Example 31, is applied to the bond glass film, and the green laminated structure 111 is disposed so that the joining surface 111a thereof contacts the organic adhesive/bond glass layers on the joining surface 220a of the AlN base member 220.

The assembly is then heated to a temperature of about 1000° C. for about 60 minutes to densify the glass-ceramic layers of the green multi-layer laminated structure 111 into the glass-ceramic substrate 112 of FIG. 4 and to allow the bond glass layer 310 to react with and bond to the glass-ceramic substrate 112 and the core 220 as described above. The glass-ceramic substrate 112 is thus firmly bonded to the AlN base member 220 via a bond glass layer 310 interposed between the respective joining surfaces 112a and 220a of the glass-ceramic substrate 112 and the base member 220 to form the ceramic packaging assembly 100".

While the present invention has been particularly shown and described with reference to the preferred mode as illustrated in the Examples and drawings, it will be understood by one skilled in the art that various changes in detail may be effected therein without departing from the spirit and scope of the invention as defined by the claims.

What is claimed is:

1. A glass-ceramic material consisting essentially of $SiO_2$ in a range of 45-58 wt %, $Al_2O_3$ in a range of 10-18 wt %, MgO in a range of 10-25 wt % and $B_2O_3$ present in an amount up to 10 wt %, said glass-ceramic material having a thermal expansion coefficient in a range of 3-6 ppm/° C., a dielectric constant of less than 5 and a Quality factor (Q) of at least 400.

2. The glass-ceramic material of claim 1, further including at least one of $P_2O_5$ in an amount up to 4 wt %, and $GeO_2$ in an amount up to 10 wt %.

3. The glass-ceramic material of claim 1, wherein said glass-ceramic material further includes an additive that is added as a particulate after said glass-ceramic material is formed and pulverized into a powder, said additive comprising at least one material selected form the group consisting of crystalline silica, a material having a high thermal expansion coefficient and a main phase of crystalline silica, cordierite, fused silica and a borosilicate glass.

4. The glass-ceramic material of claim 3, wherein said additive comprises 1-15 wt % crystalline silica.

5. The glass-ceramic material of claim 3, wherein said additive comprises 4-12 wt % of a borosilicate glass.

6. The glass-ceramic material of claim 3, wherein said additive comprises 1-15 wt % of a material consisting essentially of 50-55 wt % $SiO_2$, 12-18 wt % $Al_2O_3$, 10-18 wt % MgO and 4-16 wt % ZnO and having a crystalline silica main crystal phase.

7. An electronic package comprising:
a base member; and
a glass-ceramic substrate bonded to said base member, said glass-ceramic substrate consisting essentially of $SiO_2$ in a range of 45-58 wt %, $Al_2O_3$ in a range of 10-18 wt %, MgO in a range of 10-25 wt % and $B_2O_3$ present in an amount up to 10 wt %, said glass-ceramic substrate having a thermal expansion coefficient in a range of 3-6 ppm/° C., a dielectric constant of less than 5 and a Quality factor (Q) of at least 400.

8. The electronic package of claim 7, further comprising a bonding layer interposed between said base member and said glass-ceramic substrate.

9. The electronic package of claim 8, wherein said bonding layer comprises one of a solder and a bond glass.

10. The electronic package of claim 7, wherein said glass-ceramic material further includes an additive that is added as a particulate after said glass-ceramic material is formed and pulverized into a powder, said additive comprising at least one material selected form the group consisting of crystalline silica, a material having a high thermal expansion coefficient and a main phase of crystalline silica, cordierite, fused silica and a borosilicate glass.

11. A substrate for an electronic package comprising the glass-ceramic material of claim 1.

* * * * *